United States Patent
Tsutsui et al.

(10) Patent No.: US 6,949,750 B2
(45) Date of Patent: Sep. 27, 2005

(54) RADIATION DETECTING ELEMENT AND METHOD OF MANUFACTURING THE SAME

(75) Inventors: Hiroshi Tsutsui, Yawata (JP); Katsuyuki Kaneko, Moriguchi (JP); Takayoshi Yuzu, Ikoma (JP); Toshiyoshi Yamamoto, Sanda (JP); Yoshiteru Il, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 150 days.

(21) Appl. No.: 10/240,458

(22) PCT Filed: Mar. 28, 2001

(86) PCT No.: PCT/JP01/02551

§ 371 (c)(1),
(2), (4) Date: Feb. 14, 2003

(87) PCT Pub. No.: WO01/75478

PCT Pub. Date: Oct. 11, 2001

(65) Prior Publication Data

US 2003/0183749 A1 Oct. 2, 2003

(30) Foreign Application Priority Data

Mar. 30, 2000 (JP) ........................................ 2000-093870

(51) Int. Cl.⁷ .......................... H01L 21/00; H01L 31/00
(52) U.S. Cl. ............................... 250/370.11; 250/214.1; 438/57
(58) Field of Search ..................... 250/370.11, 370.09, 250/370.08, 367, 214.1; 438/57

(56) References Cited

U.S. PATENT DOCUMENTS

| 5,132,539 A | * | 7/1992 | Kwasnick et al. | ...... 250/361 R |
| 5,187,369 A | * | 2/1993 | Kingsley et al. | ...... 250/370.11 |
| 5,530,568 A | * | 6/1996 | Yamamoto et al. | ...... 349/143 |
| 6,042,267 A | * | 3/2000 | Muraki et al. | ...... 378/169 |
| 6,262,422 B1 | * | 7/2001 | Homme et al. | ...... 250/370.11 |
| 6,278,118 B1 | | 8/2001 | Homme et al. | |
| 6,455,855 B1 | * | 9/2002 | Kwasnick et al. | ...... 250/361 R |
| 2001/0004552 A1 | | 6/2001 | Tang et al. | |
| 2002/0079457 A1 | * | 6/2002 | Nakazawa | ............. 250/370.09 |

FOREIGN PATENT DOCUMENTS

| EP | 0 903 590 | 1/2002 |
| JP | 03-029873 | 2/1991 |
| JP | 03-077941 | 4/1991 |
| JP | 10-39099 | 2/1998 |
| JP | 11-304931 | 11/1999 |
| WO | WO98/36291 | 8/1998 |

OTHER PUBLICATIONS

International Search Report for application No. PCT/JP01/02551, Jun. 26, 2001.
English Translation of PCT/ISA/210.

* cited by examiner

Primary Examiner—David Porta
Assistant Examiner—Faye Polyzos
(74) Attorney, Agent, or Firm—RatnerPrestia

(57) ABSTRACT

The present invention provides a method of preventing or reducing X-ray-induced temporal changes of a semiconductor photoelectric conversion film formed on a TFT substrate, in which a protective film or sheet is used to protect the semiconductor photoelectric conversion film in order to improve weather resistance such as light blocking effect and moisture resistance.

The present invention provides a radiation detecting element characterized by including a substrate having a plurality of pixel areas formed thereon, each having at least one switching element and at least one charge storage capacity, a photoelectric conversion film formed on the individual pixel areas for converting radiation into electrical charge, a protective film individually covering the photoelectric conversion film and having an area that is substantially the same as or larger than that of at least the photoelectric conversion film and a seal member and a sealant arranged so as to enclose the photoelectric conversion film, for fixing the protective film.

16 Claims, 5 Drawing Sheets

(a)

(b)

(c)

(d)

(e)

(a)

(b)

(c)

(d)

(e)

(a)

(b)

(c)

RADIATION DETECTING ELEMENT AND METHOD OF MANUFACTURING THE SAME

THIS APPLICATION IS A U.S. NATIONAL PHASE APPLICATION OF PCT INTERNATIONAL APPLICATION PCT/JP01/02551.

TECHNICAL FIELD

The present invention relates to a radiation detecting element and a method for manufacturing the same for improvement of moisture resistance and light resistance and mechanical protection of a photoelectric conversion film.

BACKGROUND ART

X-ray penetration images for medical or industrial applications were photographed using X-ray films. Subsequently, sensors emerged which convert an image directly into an electric signal without using any X-ray films. Such sensors include, for example, image pickup devices using an X-ray image intensifier+an image pickup tube or CCD, or small-sized image pickup elements such as CCDs having a photodiode as well as a scintillator provided thereon. Furthermore, in recent years, large-sized two-dimensional X-ray sensors (X-ray flat panel sensors) have been developed using a TFT (thin film transistor) technology used for liquid crystal displays.

These X-ray sensors include a type that uses a scintillator to covert an X ray into light and then uses a photodiode to convert the light into electricity, and a type that uses a semiconductor photoelectric conversion film to convert an X ray directly into an electric signal.

In these X-ray sensors, some scintillators or semiconductor photoelectric conversion films have a hygroscopic property and may consequently have their characteristics degraded. In particular, for the semiconductor photoelectric conversion films, absorbed moisture reduces electric resistance to cause a large leakage current to flow, thereby degrading their characteristics or causing a short circuit.

CCDs are so small as to be entirely packaged easily. Further, as disclosed in Patent Nos. 03-029873 and 03-077941, a configuration provided with a protective film is known in which a moisture resistive resin that can be formed into a film by vapor deposition on a CCD is formed into a film directly on a scintilator. All the disclosures in Patent Nos. 03-029873 and 03-077941 are incorporated herein by reference in their entirety.

FIG. 5 is a partial sectional view of a CCD packaged using the above-mentioned conventional techology. As shown in the figure, the above-mentioned configuration comprises light-receiving elements 52 and a signal line 53 arranged on a substrate 51, a passivation film 55 that protects the light-receiving elements 52 and the signal line 53, a scintillator 57 provided on the passivation film 55 so as to correspond to the top of the light-receiving elements 52, a protective film 511 formed so as to cover the scintillator 57 and the passivation film 55, and a sealing resin 512 provided at an end of the protective film 511 corresponding to the junction between the passivation film 55 and the protective film 511. Further, at an end of the CCD, a bonding pad 54 is provided on a main surface of the substrate 51 to connect the signal line 53 to an external portion. Furthermore, the protective film 511 has a three-layered structure including a non-moisture-permeable metal layer 59 an resin layers 510 and 58 that sandwich the metal layer 59 therebetween.

However, with this configuration, the protective film 511 is formed by plasma CVD, so that after all the films of entire CCD, including the back and side surfaces of the substrate 1, have been formed, films must be removed which have been formed on the back surface of the substrate 1 and on the bonding pad 54 in a peripheral portion of the passivation film 55. As a result, the process of producing the CCD has difficulties.

Further, with the above described technology, the protective film 511, formed by plasma CVD, is in tight contact with the scintillator 57. Accordingly, if external pressure is exerted on the protective film, it is reached to the scintillator 57 through the protective film to affect the physical resistance of the X-ray conversion film.

Furthermore, at the junction between the substrate and the protective film, the main surface of the substrate 51 is joined to the resin layers 510 and 58 of the protective film 511, with the junction sealed with the sealing resin 512, as shown in FIG. 5. However, the sealing resin 512 is jointed to the resin layers 510 and 58 of the protective film 511, and moisture may invade the scintillator 57 through this junction. Consequently, this structure does not have sufficient moisture resistance. Another problem is that a large amount of time and labor is required to produce the protective film 511 of the layered structure.

On the other hand, for large-sized x-ray sensors using the TFT technology, the method of packaging the entire substrate has the disadvantages of an operation process, insufficient airtightness, and the like. Further, the maintenance or the like of these X-ray sensors is very cumbersome. Accordingly, the method of packaging the entire substrate is not appropriate for the large-sized X-ray sensor using the TFT technology.

Another problem is that both the CCD and the large-sized X-ray sensor using the TFT technology require separate material for covering, thus increasing costs.

DISCLOSURE OF THE INVENTION

The present invention is provided to solve the above described problems, and it is a basic object thereof to provide radiation detecting element and a manufacturing method therefor which enable a photoelectric conversion film formed on a substrate to be covered so as to reliably provide moisture resistance and which also enable this film to be easily formed.

One aspect of the present invention is a radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes; and non-moisture permeable covering means of covering said individual electrodes, said common electrode, and said converting means and fixed to a surface of said substrate on which said image area is formed, and in that:

an interval of a predetermined size is formed between said covering means and said common electrode.

Another aspect of the present invention is a radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes;

covering means of covering said individual electrodes, said common electrode, and said converting means and fixed to a surface of said substrate on which said image area is formed, the covering means having a three-layered structure in which a non-moisture permeable layer is sandwiched between two other layers; and non-moisture permeable sealing means of sealing a peripheral portion of said covering means, and in that:

in the peripheral portion of said covering means, said sealing means and the non-moisture permeable layer of said covering means are in directly tight contact with each other.

Still another aspect of the present invention is a radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes;

non-moisture permeable covering means formed only on said common electrode; and non-permeable sealing means of sealing an area extending from a peripheral portion of said covering means to a surface of said substrate.

Yet still another aspect of the present invention is the radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes; and non-permeable sealing means of sealing an area extending from a peripheral portion of said common electrode to a surface of said substrate, and in that:

said common electrode has non-moisture permeability.

Still yet another aspect of the present invention is the radiation detecting element, wherein said converting means is a semiconductor photoelectric conversion film.

A further aspect of the present invention is the radiation detecting element, wherein said semiconductor photoelectric conversion film is amorphous selenium, iodide, bromide, or telluride, or any mixture thereof.

A still further aspect of the present invention is the radiation detecting element, wherein said converting means has a scintillator and a photodiode.

A yet further aspect of the present invention is the radiation detecting element, wherein said scintillator has thallium-activated sodium iodide (NaI (Tl)), thallium-activated cesium iodide (CsI (Tl)), sodium-activated cesium iodide (CsI (Na)), or bismuth gemanate ($B1_4Ge_3O_{12}$), or any mixture thereof.

A still yet further aspect of the present invention is the radiation detecting element, wherein said covering means is glass.

An additional aspect of the present invention is the radiation detecting element, wherein said glass blocks of ultraviolet rays and visible light of short wavelengths belonging to a blue area.

A still additional aspect of the present invention is the radiation detecting element, wherein said covering means has a layered structure.

A yet additional aspect of the present invention is the radiation detecting element, wherein said layered structure includes a resin layer and a metal or glass layer.

A still yet additional aspect of the present invention is a manufacture method for a radiation detecting element comprising the steps of:

forming at least individual electrodes corresponding to pixel areas, on substrate;

forming converting means of converting radiation into electricity, on an image area comprising said pixel areas;

arranging a common electrode corresponding to said individual electrodes, on said image area; and fixing non-moisture permeable covering means of covering said individual electrodes, said common electrode, and said converting means, to a surface of said substrate on which said image area is formed, and in that:

an interval of a predetermined size is formed between said covering means and said common electrode.

A supplementary aspect of the present invention is a manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area;

fixing covering means of covering said individual electrodes, said common electrode, and said converting means, to a surface of said substrate on which said image area is formed, the covering means having a three-layered structure in which a non-moisture permeable layer is sandwiched between two other layers; and sealing a peripheral portion of said covering means using non-moisture permeable sealing means, and in that:

in the peripheral portion of said covering means, said sealing means and the non-moisture permeable layer of said covering means are in directly tight contact with each other.

A still supplementary aspect of the present invention is a manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area;

forming non-moisture permeable covering means only on said common electrode; and sealing an area extending from a peripheral portion of said covering means to a surface of said substrate, using non-permeable sealing means.

A yet supplementary aspect of the present invention is a manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area; and sealing an area extending from a peripheral portion of said common electrode to a surface of said substrate, using non-permeable sealing means, and in that:

said common electrode has non-moisture permeability.

As described above, the present invention uses 1) a method of using a thin glass plate as a seal member to seal the entire photoelectric converting section, 2) a method of using a sheet composed of a metal and resin layers to seal the photoelectric converting section, 3) a method of forming a metallic thin film on an opposite electrode of a photoelectric conversion film to improve moisture resistance, or 4) a method of making a glass container with a dented central portion to improve moisture resistance.

DESCRIPTION OF SYMBOLS

Figure 1:
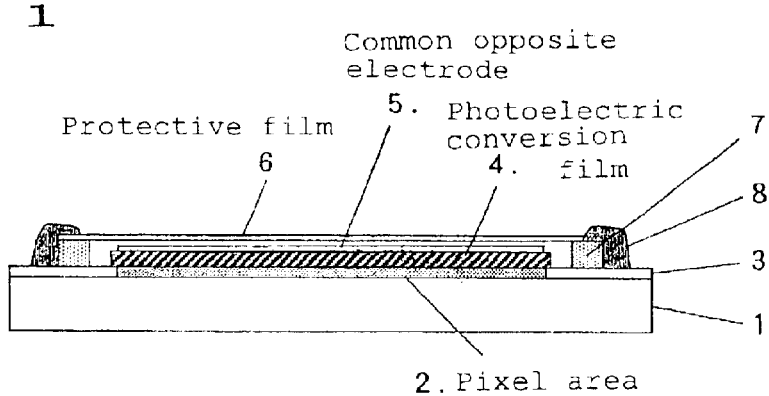
FIGS. 1(a)–1(e) are diagrams showing a configuration and a manufacture process according to a first embodiment of the present invention.
Figure 1:
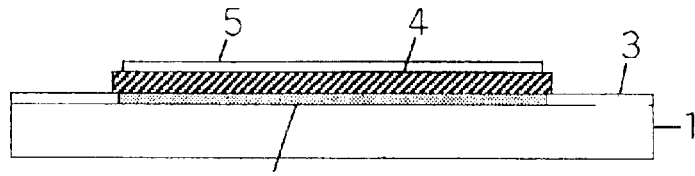
Figure 1:
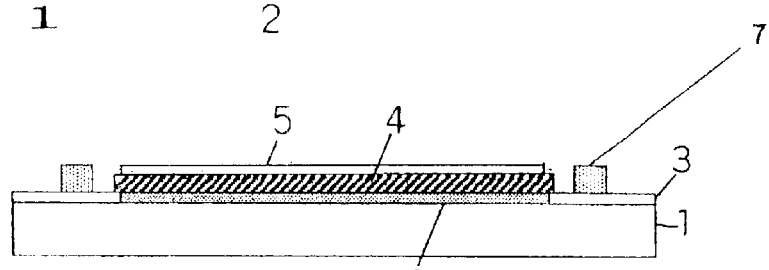
Figure 1:
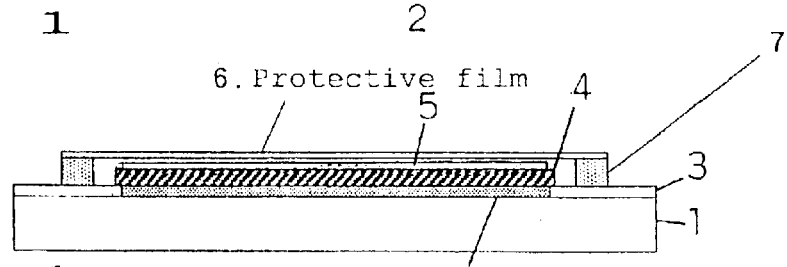
Figure 1:
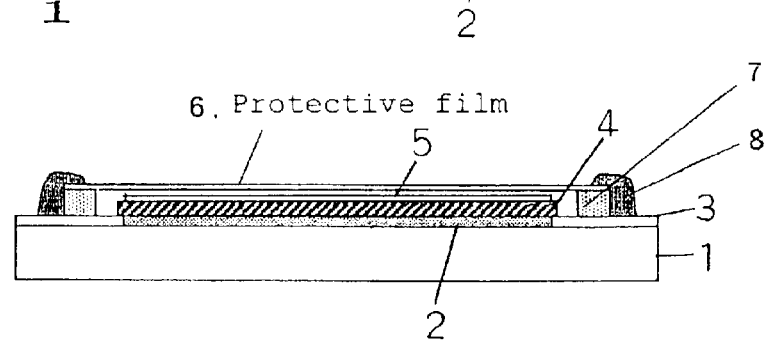

1 Substrate
2 Pixel area
3 Lead wired area
4 Photoelectric conversion film
5, 25 Common opposite electrode
6, 29 Protective film
7 Seal member
8 Sealant
26 Protective metallic thin film
36 Protective cover

BEST MODE FOR CARRYING OUT THE INVENTION

Embodiments of the present invention will be described below with reference to the drawings.
(Embodiment 1)

FIG. 1 shows a radiation detecting element according to Embodiment 1 of the present invention, and a manufacture process therefor, shown step-by-step. In FIG. 1(a), a substrate 1 composed of glass has a pixel area 2 and a lead wired area 3 formed thereon. The pixel area has a plurality of pixels two-dimensionally formed therein. Each pixel has at least one pixel area and at least one charge storage capacity formed therein. On the pixel area 2, a photoelectric conversion film 4 is formed, and on the photoelectric conversion film 4, a common opposite electrode 5 is formed which has substantially the same size as the photoelectric conversion film. A protective film 6 is provided thereon and has a peripheral portion isolated from the exterior by a seal member 7 or by the seal member 7 and a sealant 8. In this case, the protective film 6 is arranged so as to form a predetermined interval between itself and the photoelectric conversion film. Accordingly, the photoelectric conversion film 4 and the common opposite electrode 5 are arranged in the space formed by the pixel area 2, the lead wired area 3, the seal member 7, the protective film 6, and the sealant 8.

Next, the manufacture method for the radiation detecting element according to this embodiment will be described with reference to FIGS. 1(b) to 1(e).

In FIG. 1(b), the substrate 1 composed of glass has the pixel area 2 and the lead wired area 3 formed thereon. In a basic structure, the pixel area has a TFT switching element, a charge storage capacity, and an electrode as in a substrate used for a liquid crystal display.

In the pixel area 2, the photoelectric conversion film 4 is made of a semiconductor film to convert the energy of an X ray into charges (electrons and holes) and store the amount of charges generated in the charge storage capacity so that a switching circuit using TFTs can take out this amount as an electric signal through the lead wired area 3. Further, the lead wired area 3 is pad for TAB packaging. Although not illustrated, the photoelectric conversion film 4 is connected to the pixel area via split electrodes on the pixel area. Further, the photoelectric conversion film 4 has a common opposite electrode 5 formed thereon and corresponding to and shared by all the split electrodes on the pixel area. The common opposite electrode 5 is connected to high-voltage wiring on the substrate 1. Materials for the photoelectric conversion film 4 may include iodide such as amorphous selenium (a-Se), mercury iodide ($HgI_2$), lead iodide ($PbI_2$), thallium iodide ($TlI_2$), or bismuth iodide ($BiI_3$), bromide such as mercury bromide ($HgBr_2$), lead bromide ($PbBr_2$), thallium bromide ($TlBr_2$), or bismuth bromide ($BiBr_3$), telluride such as cadmium telluride (CdTe) or cadmium zinc telluride (CdZnTe), and a mixture thereof. However, since a TFT substrate has an upper-limit temperature of about 250°C., the photoelectric conversion film may be formed of iodide such as amorphous selenium (a-Se), mercury iodide ($HgI_2$), lead iodide ($PbI_2$), thallium iodide ($TlI_2$), or bismuth iodide ($BiI_3$), or bromide such as mercury bromide ($HgBr_2$), lead bromide ($PbBr_2$), thallium bromide ($TlBr_2$), or bismuth bromide ($BiBr_3$). The substrate 1, pixel area 21 lead wired area 3, and photoelectric conversion film 4, used in FIG. 1, are the same as those used in the subsequent description.

Now, FIG. 1(b) shows that the photoelectric conversion film 4 has been formed on the pixel area 2. Although not illustrated, the photoelectric conversion film 4 is connected to the pixel area via the split electrodes on the pixel area. Further, the photoelectric conversion film 4 has the common opposite electrode 5 formed thereon and connected to the high-voltage wiring on the substrate 1.

Next, FIG. 1(c) shows that the seal member 7 has been formed on the lead wired area 3 in the periphery of the photoelectric conversion film 4. As shown in this figure, the seal member 7 is formed to have a larger height from the lead wired area 3 than the main surface of the common opposite electrode 5. To form the seal member 7, a seal member extruding apparatus is used to linearly draw it as in the case with a liquid crystal display assembly process. To control the height of the seal member 7, a filler such as bead-like or cylindrical pieces of glass or $SiO_2$ ceramics of the same diameter, which have already been mixed together, can be filled into the seal member 7 and pressurized for setting after the protective film 6 has been stuck to the seal member 7. Suitable materials for the seal member 7 include a heat setting epoxy adhesive, room temperature setting epoxy material, heat setting acrylic material, and ultraviolet setting acrylic material. The seal member 7 may also be formed of glass material.

Next, FIG. 1(d) show that the protective film 6 has been placed on the seal member 7. The most easily available material for the protective film 6 is a glass plate. A glass plate of 1 mm or less thickness is substantially flexible if the substrate 1 is large in area. When the pressure in the space between the protective film 6 and the substrate 1 is slightly reduced, the protective film 6 is sucked to the common opposite electrode 5 and can thus be stably positioned.

Furthermore, when the seal member 7 is set in this state, the protective film 6 is fixed with a gap of a predetermined size between itself and the common opposite electrode 5. In this case, if the filler filled into the seal member 7 has a diameter equivalent to or slightly larger than the thickness of the photoelectric conversion film 4, pressure-induced damage to a peripheral portion of the photoelectric conversion film 4 can be reduced even if the seal member 7 is set under a reduced pressure.

Next, FIG. 1(e) shows an example in which a peripheral portion of the protective film 6 is sealed with the sealant 8 via the seal member 7 in order to improve airtightness and moisture resistance. Materials for the sealant 8 may include silicone- and epoxy-based resins such as silicon oxide, silicon nitride, glass beads, and ceramic beads into which a material that is not penetrated by moisture is densely filled.

Thus, according to the radiation detecting element and manufacture method therefor according to this embodiment, the protective film 6, the seal member 7, and the sealant 8 can be provided with improved moisture and environmental resistance.

In this respect, light resistance can further be improved by forming the glass material used for the protective film 6 using UV cut glass, colored glass, or the like or further forming a metallic thin film on the surface of the glass material.

(Embodiment 2)

Figure 2:
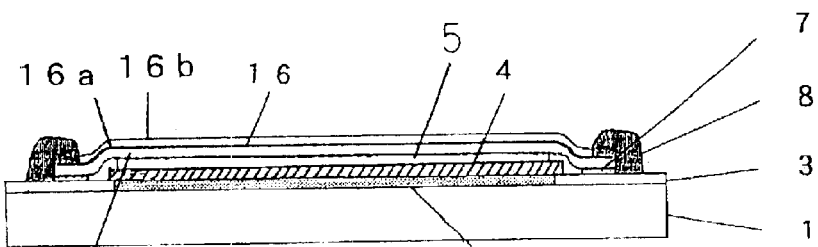
FIGS. 2(a)–2(e) are diagrams showing a configuration and a manufacture process according to a second embodiment of the present invention.
Figure 2:
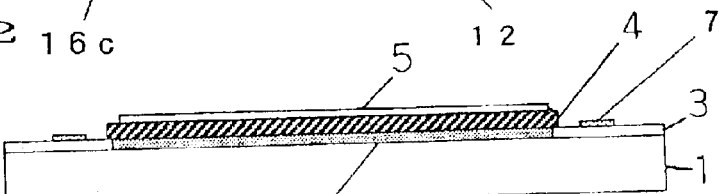
Figure 2:
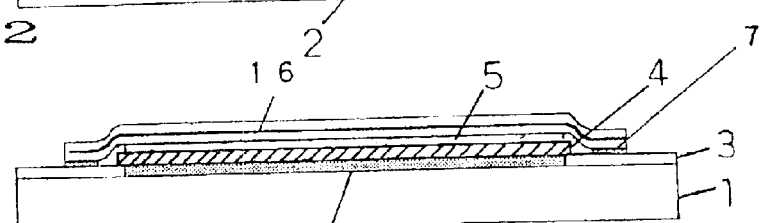
Figure 2:
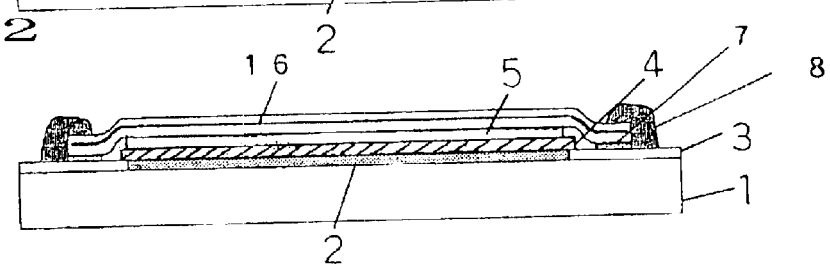
Figure 2:
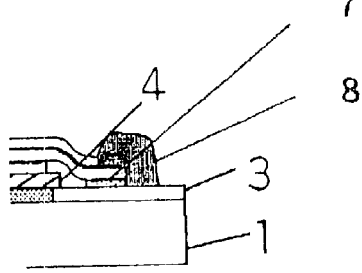

FIG. 2 shows a radiation detecting element according to Embodiment 2 of the present invention, and a manufacture process therefor, shown step-by-step.

In FIG. 2(a), the same reference numerals as those in FIG. 1 denote the same or equivalent parts. Further, reference numeral 16 denotes a protective sheet comprising a metallic thin film 16a sandwiched between resins 16b and 16c. The radiation detecting element according to this embodiment is constructed similarly to Embodiment 1 except that the protective sheet 16 is the member covering the common opposite electrode 5 and photoelectric conversion film 4. Thus, this difference will be mainly described below.

The manufacture method for the radiation detecting element according to this embodiment will be described with reference to FIGS. 2(b) to 2(e).

FIG. 2(b) shows that the seal member 7 has been formed on the lead wired area 3 in the periphery of the photoelectric conversion film 4. To form the seal member 7, a seal member extruding apparatus is used to linearly draw it as in a liquid crystal display assembly process, as described previously.

Next, FIG. 2(c) shows a step of covering the photoelectric conversion film 4 with the protective sheet 16 and providing the seal member for adhesion and sealing.

FIG. 2(d) shows that the sealant 8 has been provided to seal the structure in order to improve the moisture resistance of the seal portion.

In this embodiment, the protective sheet 16 comprises the metallic thin film 16a such as Al sandwiched between the resins 16b and 16c as described above. A characteristic of this structure is that the metallic thin film 16a can block light and the moisture-resistant resins 16b and 16c are insulated. The metallic thin film 16a is generally formed of Al. Further, the metallic thin film 16a maybe formed by vapor-depositing the appropriate material on a resin sheet or sandwiching a metallic foil between resins.

The presence of the metallic thin film 16a substantially improves environmental resistance such as light blocking effect and moisture resistance, and this improvement is facilitated by using the metallic foil. Since the metallic thin film 16a serves to provide environmental resistance such as significant light blocking effect and moisture resistance, the composition of the resins 16b and 16c is not particularly limited. However, as shown in FIG. 2(e), the resins 16b and 16c are further constructed so that that part of the resin 16b In the top surface of the protective sheet 16 which corresponds to an end of the protective sheet 16 is peeled off expose a part of the metallic thin film 16a. Then, the exposed part is sealed with the sealant 8. This improves the non-moisture permeability of the end of the junction between the protective sheet 16 and the substrate 1, thereby further improving the non-moisture permeability and environmental resistance of the protective sheet 16.

Further, in the above described embodiment, the protective sheet 16 and the common opposite electrode 5 are arranged so as to have a predetermined distance therebetween, as in Embodiment 1. However, the protective sheet 16 and the common opposite electrode 5 may be arranged in contact with each other.

(Embodiment 3)

Figure 3:
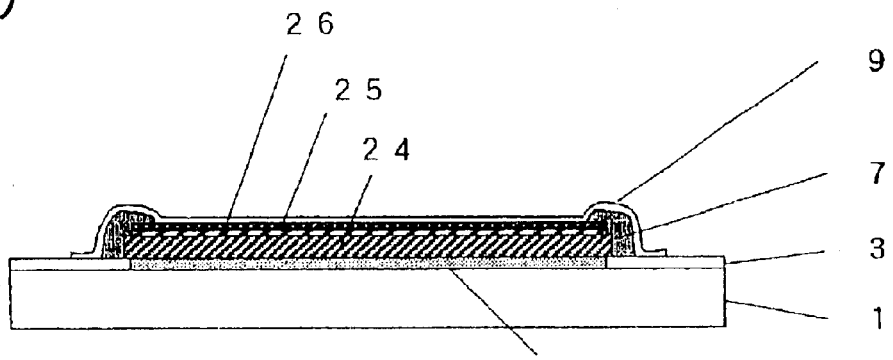
FIG. 3(a)–3(e) are diagrams showing a configuration and a manufacture process according to a third embodiment of the present invention.
Figure 3:
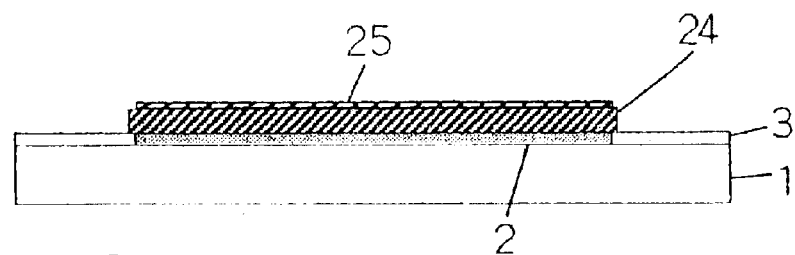
Figure 3:
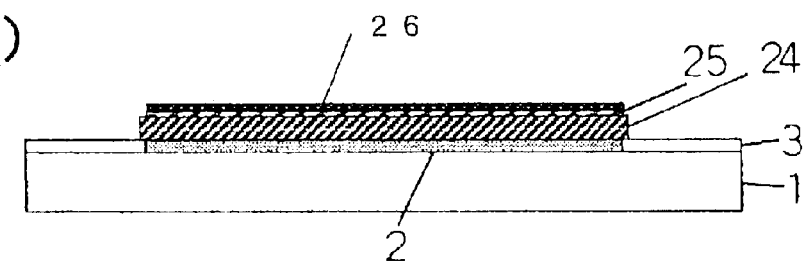
Figure 3:
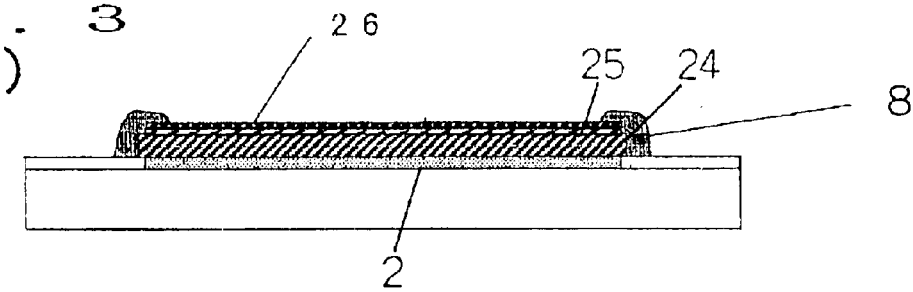
Figure 3:
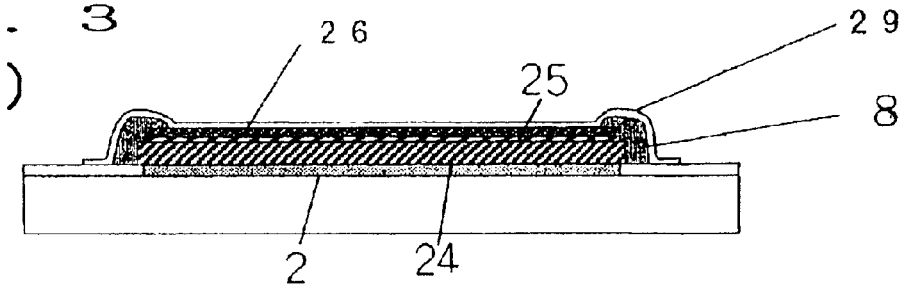

FIG. 3 shows a radiation detecting element according to Embodiment 3 of the present invention, and a manufacture process therefor, shown step-by-step.

In FIG. 3(a), the same reference numerals as those in FIG. 1 denote the same or equivalent parts. Further, reference numeral 25 denotes a common opposite electrode, 26 is a protective metallic thin film, and 29 is a protective film. The radiation detecting element according to this embodiment basically has same construction and effects as the above described embodiments, but differs therefrom in that the protective metallic thin film 26 is provided on the common opposite electrode 25 and has its end sealed with the sealant 8, and the protective film 29 covers a portion including the protective metallic thin film 26 and the sealant 8.

That is, in this embodiment, the protective metallic thin film 26 is used as the protective film in each of the above described embodiments to provide moisture resistance, light blocking effect, and insulating properties. Consequently, the protective film 29 is used to cover the protective metallic thin film 26, the high-voltage portion of which is otherwise exposed to the exterior, the sealant 8, and a part of the lead wired area 3.

The manufacture method for the radiation detecting element according to this embodiment will be described with reference to FIGS. 3(b) to 3(e).

FIG. 3(b) shows that the common opposite electrode 25 has been formed on the photoelectric conversion film 4. In this case, the material used for the common opposite electrode 25 is limited by the semiconductor material used for the photoelectric conversion film 4. This is because the photoelectric conversion film 4 must be sensitive over its thickness in order to obtain a sufficient sensitivity for X rays. The necessity of such a sensitivity means that in the interface between the electrode and the semiconductor, no barrier is generated but an ohmic or similar junction must be achieved. Whether an ohmic junction or a barrier is obtained depends on the combination of the material for the semiconductor and the metallic material used for the electrode.

However, it is generally difficult to form thick electrode film using a metallic material allowing an ohmic junction to be formed, so that a firm common opposite electrode 25 is obtained by forming a metallic thin film allowing an ohmic junction to be formed and further forming, on the protective metallic thin film 26, a metallic thin film such as Al which is easy to form (the step shown in FIG. 3(c)).

Next, FIG. 3(d) shows how the peripheral portions of the photoelectric conversion film 4, on which the protective metallic thin film 26 has been formed, and of the common opposite electrode 25 are sealed with the sealant 8. In this state, the protective metallic thin film 26 and the sealant 8 serve to provide the structure with non-moisture permeability similar to that in the above described conventional example.

However, in this state, the high-voltage portion of the protective metallic thin film 26 which is electrically connected to the common opposite electrode 25 is exposed to the exterior. Further, if the material for the protective metallic thin film 26 is metal such as Cu, its surface may show a chemical reaction in the atmosphere to start degrading the protective metallic thin film 26 via a gap in the sealant 27, thereby reducing the sealing function.

Thus, as shown in FIG. 3(e), to improve the state in FIG. 3(d), the protective film 29 is formed on the protective metallic thin film 26. At this time, the protective film 29 collectively covers the main surface of the protective metallic thin film 26, which is exposed to the exterior, the sealant 8, and a part of the lead wired area. The protective film 29 prevents the high-voltage portion from being exposed, while preventing the protective metallic thin film 26 from being degraded, thereby further reliably providing the structure with non-moisture permeability.

In the above embodiments, the common opposite electrode 25 and the protective metallic thin film 26 are stacked together to improve non-moisture permeability. However, the protective metallic thin film 26 may be omitted provided that the common opposite electrode 25 is composed of a metallic material which allows an ohmic junction to be formed and which can still be formed to have a sufficient thickness. In this case, the common opposite electrode 25 also acts as covering means of the present invention which has the function of a protective film for providing the structure with non-moisture permeability.

Further, in the above description, the protective metallic thin film 26 is made of metal. However, the covering means of the present invention is not limited to this material, but the protective metallic in film 26 may be composed of another material such as glass as long as it is only placed or the common electrode and has non-moisture permeability. In this case, the arrangement corresponding to the protective film 29 may be omitted, or the protective film 29 need not necessarily cover all positions corresponding to the protective metallic thin film 26 but has only to cover at least the boundary between the protective metallic thin film 26 and the sealant 8.

Further, in the above description, the protective film 29 is in contact with the protective metallic thin film 26, but an interval of a predetermined size may be formed between the protective film 29 and the protective metallic thin film 26. In this case, the protective film 29 can absorb externally applied force, thereby preventing physical force from being exerted on the protective metallic thin film 26, common opposite electrode 25, and photoelectric conversion film 24.

(Embodiment 4)

Figure 4:
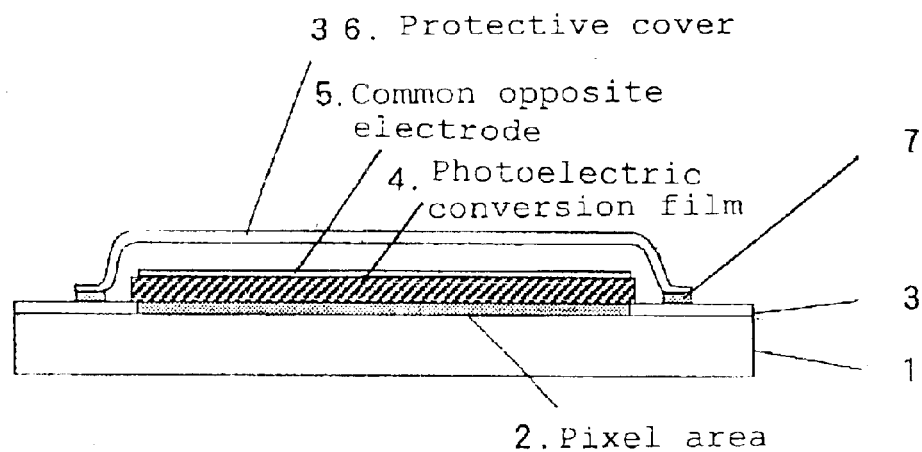
FIG. 4(a)–4(c) are diagrams showing a configuration and a manufacture process according to a fourth embodiment of the present invention.
Figure 4:
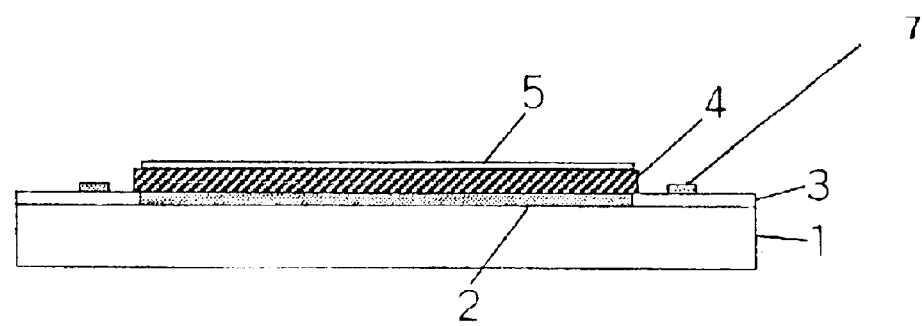
Figure 4:
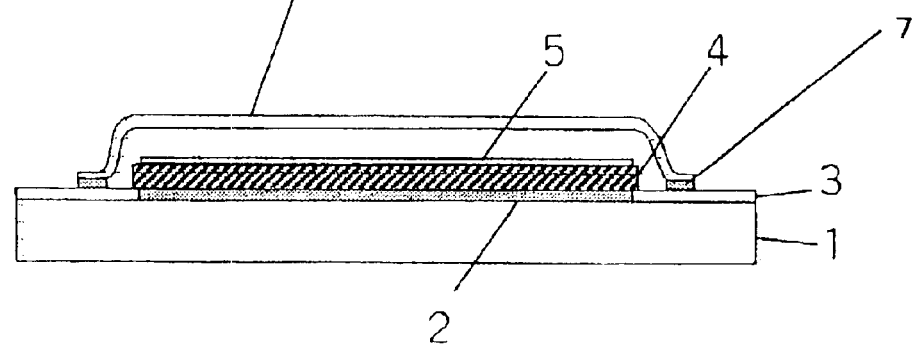
Figure 5:
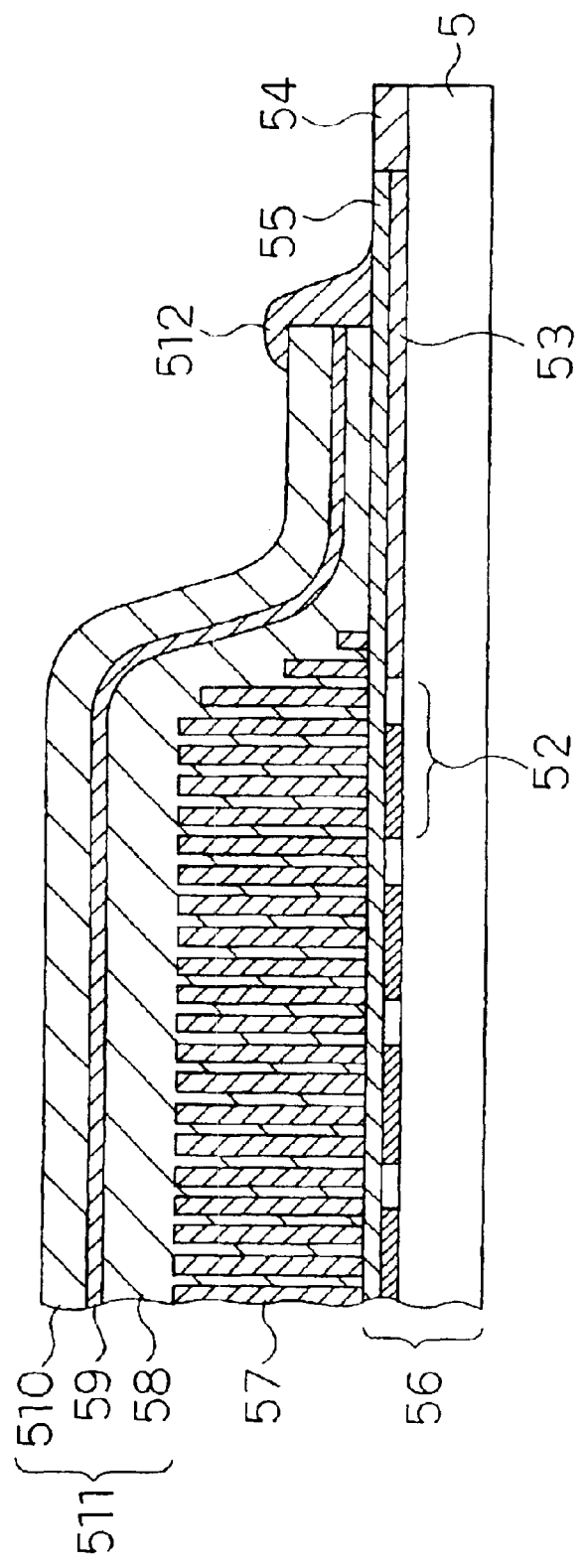
FIG. 5 is a partial sectional view showing the configuration of a CCD according to the prior art.

FIG. 4 shows a radiation detecting element according to Embodiment 4 of the present invention, and a manufacture process therefor, shown step-by-step.

In FIG. 4(a), the same reference numerals as those in FIG. 1 denote the same or equivalent parts. Further, reference numeral 36 denotes a protective cover. The radiation detecting element according to this embodiment basically has a configuration and effects similar to those of Embodiment 1 but differs therefrom in that a protective cover 36 stuck to the substrate with the seal member 7 covers the photoelectric conversion film 4 together with the common opposite electrode 5, provided thereon.

FIG. 4(b) shows that the seal member 7 has been formed on the lead wired area 3 in the periphery of the photoelectric conversion film 4. This method is similar to that of the other embodiments, described above.

FIG. 4(c) shows that the element has been completed by sticking the protective cover 36 to the surface of the seal member 7.

In addition to the effects of Embodiment 1, this embodiment has the following effect: The protective cover 36 has a certain height, so that even if external pressure is applied to the radiation detecting element, the protective cover 36 acts as a buffer that absorbs the pressure, thereby protecting the photoelectric conversion film 4 and common opposite electrode 5, both located inside the cover. This also eliminates the need to mold a high seal member 7, thereby simplifying the process.

In this embodiment, the protective cover 36 is made of resin, but to improve moisture resistance and light blocking effect, a metallic thin film may be coated on the inner wall of the protective cover 36 so that the protective cover has a two-layered configuration. However, since the photoelectric conversion film 4 has an opposite electrode 5 provided thereon and to which a high voltage is applied, either surface of the photoelectric conversion film 4 must be coated with resin or the gap must be widened in order to prevent a short circuit.

Further, as in the case with Embodiment 1, a sealant may span the seal member 7, the lead wired area 3, and the end of the protective cover 36 in order to further improve non-moisture permeability.

In the above described embodiments, the protective film 6, protective sheet 16, seal member 7, protective metallic thin film 26, and protective cover 36 are examples of the covering means of the present invention. The opposite common electrode 5 and common opposite electrode 25 are examples of the common electrode of the present invention. The sealant 8 is an example of the sealing means of the present invention.

Further, in the above description, the covering means of the present invention is composed of two layers of metal and resin or three layers of resins and metal sandwiched therebetween. However, the number of layers is not limited to this aspect but may be arbitrary as long as the structure can maintain non-moisture permeability. Furthermore, if the covering means of the present invention is implemented as glass, it desirably blocks ultraviolet rays and visible light of short wavelengths belonging to a blue area.

Moreover, in the above described embodiments, the pixel area 2, the photoelectric conversion film 4, and the common opposite electrode 5 are used as a radiation detecting element to convert an incident X ray directly into electricity. However, the converting means of the present invention may have a scintillator and a photodiode so that the scintillator converts an incident X ray into light, which is then converted into electricity by the photodiode. In this case, the material for the scintillator is thallium-activated sodium iodide (NaI (Tl)), thallium-activated cesium iodide (CsI (Tl)), sodium-activated cesium iodide (CsI (Na)), or bismuth gemanate ($Bi_4Ge_3O_{12}$), or any mixture thereof. In short, the converting means of the present invention has only to be able to convert radiation into electricity, and is not limited by the contents of the converting process.

INDUSTRIAL APPLICABILITY

As described above, the present invention relates to a radiation detecting element and a manufacture method therefor which have very excellent effects of improving moisture resistance, weather resistance, and light blocking effect.

What is claimed is:

1. A radiation detecting element comprising:

a substrate having a least individual electrodes corresponding to pixel areas;

converting means, formed on an image area comprising said pixel areas, of converting radiation into electricity;

a common electrode arranged on said image area and corresponding to said individual electrodes;

a seal member disposed from a periphery of said converting means; and non-moisture permeable covering means of covering said individual electrodes, said common electrode, and said converting means and fixed to a surface of said substrate on which said image area is formed;

wherein a gap of a predetermined size is formed between said covering means and said common electrode, said gap being fixed by said seal member.

2. A radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes;

covering means of covering said individual electrodes, said common electrode, and said converting means and fixed to a surface of said substrate on which said image area is formed, the covering means having a three-layered structure in which a non-moisture permeable layer is sandwiched between two other layers; and non-moisture permeable sealing means of sealing a peripheral portion of said covering means, and wherein:

in the peripheral portion of said covering means, said sealing means and the non-moisture permeable layer of said covering means are in directly tight contact with each other.

3. A radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes;

non-moisture permeable covering means formed only on said common electrode; and non-permeable sealing means of sealing an area extending from a peripheral portion of said covering means to a surface of said substrate.

4. A radiation detecting element comprising:

a substrate having at least individual electrodes corresponding to pixel areas;

converting means, formed on an image area comprising said pixel areas, of converting radiation into electricity;

a common electrode arranged on said image area and corresponding to said individual electrodes; and non-permeable sealing means of sealing an area extending from a peripheral portion of said common electrode to a surface of said substrate, and in that:

said common electrode has non-moisture permeability.

5. The radiation detecting element according to any of claims 1 to 4, wherein said converting means is a semiconductor photoelectric conversion film.

6. The radiation detecting element according to claim 5, wherein said semiconductor photoelectric conversion film is amorphous selenium, iodide, bromide, or telluride, or any mixture thereof.

7. The radiation detecting element according to any of claims 1 to 4, wherein said converting means has a scintillator and a photodiode.

8. The radiation detecting element according to claim 7, wherein said scintillator has thallium-activated sodium iodide (NaI (Tl)), thallium-activated cesium iodide (CsI (Ti)), sodium-activated cesium iodide (CsI (Na)),or bismuth gemanate ($Bi_4Ge_3O_{12}$), or any mixture thereof.

9. The radiation detecting element according to any of claims 1 to 4, wherein said covering means is glass.

10. The radiation detecting element according to claim 9, wherein said glass blocks ultraviolet rays and visible light of short wavelengths belonging to a blue area.

11. The radiation detecting element according to any of claims 1, 2, and 4, wherein said covering means has a layered structure.

12. The radiation detecting element according to claims 11, wherein said layered structure includes a resin layer and a metal or glass layer.

13. A manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area;

providing a seal member disposed from a periphery of said converting means;

fixing a non-moisture permeable covering on said individual electrodes, said common electrode, and said converting means, to a surface of said substrate on which said image area is formed; and providing a gap of a predetermined size formed between said covering and said common electrode, said gap being fixed by said seal member.

14. A manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area;

fixing a covering on said individual electrodes, said common electrode, and said converting means, to a surface of said substrate on which said image area is formed, the covering having a three-layered structure in which a non-moisture permeable layer is sandwiched between two other layers; and sealing a peripheral portion of said covering using a non-moisture permeable seal, wherein:

in the peripheral portion of said covering, said seal and the non-moisture permeable layer of said covering are in directly tight contact with each other.

15. A manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area;

forming a non-moisture permeable covering only on said common electrode; and sealing an area extending from a peripheral portion of said covering to a surface of said substrate, using a non-permeable seal.

16. A manufacture method for a radiation detecting element comprising the steps of:

forming at least individual electrodes corresponding to pixel areas, on a substrate;

forming converting means of converting radiation into electricity, on an image area comprising said pixel areas;

arranging a common electrode corresponding to said individual electrodes, on said image area; and sealing an area extending from a peripheral portion of said common electrode to a surface of said substrate, using a non-permeable seal, wherein:

said common electrode has non-moisture permeability.

* * * * *

UNITED STATES PATENT AND TRADEMARK OFFICE
CERTIFICATE OF CORRECTION

PATENT NO. : 6,949,750 B2
APPLICATION NO. : 10/240458
DATED : September 27, 2005
INVENTOR(S) : Hiroshi Tsutsui et al.

It is certified that error appears in the above-identified patent and that said Letters Patent is hereby corrected as shown below:

Title Page

[54] Title of invention, "METHOD OF" should read --METHOD FOR--

[75] Inventors, "Yoshiteru Il" should read --Yoshiteru Ii--

[56] References Cited, U.S. PATENT DOCUMENTS
"2001/0004552 A1  6/2001  Tang et al." should read
--2001/0045522 A1  11/2001  Homme et al.--

Column 11,
Line 3, after word "having" change "a" to --at--

Signed and Sealed this

Fourth Day of July, 2006

JON W. DUDAS
*Director of the United States Patent and Trademark Office*